(12) United States Patent
Sakai

(10) Patent No.: US 10,979,067 B2
(45) Date of Patent: Apr. 13, 2021

(54) IMAGE PICKUP DEVICE, IMAGE PICKUP SYSTEM, AND MOVING APPARATUS

(71) Applicant: CANON KABUSHIKI KAISHA, Tokyo (JP)

(72) Inventor: Seiichirou Sakai, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/272,102

(22) Filed: Feb. 11, 2019

(65) Prior Publication Data

US 2019/0253067 A1  Aug. 15, 2019

(30) Foreign Application Priority Data

Feb. 15, 2018 (JP) .............................. JP2018-025217

(51) Int. Cl.
| | |
|---|---|
| *H03M 1/56* | (2006.01) |
| *H04N 5/355* | (2011.01) |
| *H04N 5/378* | (2011.01) |
| *H04N 5/3745* | (2011.01) |
| *H01L 27/146* | (2006.01) |
| *H04N 5/376* | (2011.01) |
| *H03M 1/18* | (2006.01) |
| *H03M 1/12* | (2006.01) |

(52) U.S. Cl.
CPC ........ *H03M 1/56* (2013.01); *H01L 27/14612* (2013.01); *H01L 27/14643* (2013.01); *H04N 5/35545* (2013.01); *H04N 5/378* (2013.01); *H04N 5/3765* (2013.01); *H04N 5/37455* (2013.01); *H04N 5/37457* (2013.01)

(58) Field of Classification Search
CPC ............. H04N 5/37457; H04N 5/3765; H04N 5/35545; H04N 5/37455; H04N 5/378; H03M 1/56

See application file for complete search history.

(56) References Cited

U.S. PATENT DOCUMENTS

| | | | |
|---|---|---|---|
| 4,663,669 | A | 5/1987 | Kinoshita et al. |
| 4,774,585 | A | 9/1988 | Suga et al. |
| 4,780,764 | A | 10/1988 | Kinoshita et al. |
| 4,821,105 | A | 4/1989 | Suga et al. |
| 7,629,568 | B2 | 12/2009 | Koizumi et al. |
| 7,906,755 | B2 | 3/2011 | Koizumi et al. |
| 8,053,718 | B2 | 11/2011 | Koizumi et al. |

(Continued)

FOREIGN PATENT DOCUMENTS

JP  2015-162751 A  9/2015

*Primary Examiner* — Christopher K Peterson
(74) *Attorney, Agent, or Firm* — Venable LLP

(57) ABSTRACT

An image pickup device, comprises: a pixel configured to output a signal based on a light reception amount; and an AD conversion unit. The AD conversion unit includes: an amplifier circuit configured to amplify a signal that is output from the pixel; a comparator circuit including an output node for outputting a comparison result signal generated by using an output signal from the amplifier circuit and a ramp signal; a memory configured to hold a digital value corresponding to the output signal, based on a result of the comparator circuit; a gain switching circuit configured to switch a gain of the amplifier circuit; and a ramp signal switching circuit configured to switch a slope of the ramp signal. The gain switching circuit and the ramp signal switching circuit are electrically connected to the output node.

20 Claims, 8 Drawing Sheets

(56) References Cited

U.S. PATENT DOCUMENTS

| | | |
|---|---|---|
| 8,106,343 B2 | 1/2012 | Arishima et al. |
| 8,582,003 B2 | 11/2013 | Sakai |
| 8,872,092 B2 | 10/2014 | Ryoki et al. |
| 8,957,364 B2 | 2/2015 | Ryoki et al. |
| 9,093,351 B2 | 7/2015 | Sakai et al. |
| 9,253,425 B2 | 2/2016 | Ryoki et al. |
| 9,667,901 B2 | 5/2017 | Sakai et al. |
| 9,681,076 B2 | 6/2017 | Oguro et al. |
| 9,762,840 B2 | 9/2017 | Yamazaki et al. |
| 9,800,257 B2 | 10/2017 | Hashimoto et al. |
| 10,116,320 B2 | 10/2018 | Hashimoto et al. |
| 2012/0105670 A1 | 5/2012 | Arishima et al. |
| 2014/0117211 A1 | 5/2014 | Arishima et al. |
| 2015/0244388 A1* | 8/2015 | Hashimoto ............. H03M 1/34 348/322 |
| 2017/0257590 A1* | 9/2017 | Kato ...................... H04N 5/378 |
| 2018/0006071 A1 | 1/2018 | Kato et al. |
| 2018/0006659 A1 | 1/2018 | Hashimoto et al. |
| 2019/0036540 A1 | 1/2019 | Hashimoto et al. |

* cited by examiner

FIG.6

| ISO | 100 | 200 | 400 | 800 | 1600 | 3200 | 6400 | 12800 | 25600 |
|---|---|---|---|---|---|---|---|---|---|
| DRIVING MODE | B | B | A | A | A | A | A | A | A |
| COLUMN AMPLIFIER GAIN (LOW LUMINANCE) | 4 | 8 | 4 | 8 | 16 | 32 | 64 | 64 | 64 |
| COLUMN AMPLIFIER GAIN (HIGH LUMINANCE) | 1 | 2 | 4 | 8 | 16 | 32 | 64 | 64 | 64 |
| RAMP GAIN (LOW LUMINANCE) | 1/4 | 1/4 | 1 | 1 | 1 | 1 | 1 | 2 | 4 |
| RAMP GAIN (HIGH LUMINANCE) | 1/4 | 1/4 | 1/4 | 1/4 | 1/4 | 1/4 | 1/4 | 1/2 | 1 |

FIG.7

| FRAME RATE | 15fps | 30fps | 60fps | 120fps | 240fps |
|---|---|---|---|---|---|
| DRIVING MODE | B | B | A | A | A |

FIG.8

| | | ISO SPEED | | | | | | | | |
|---|---|---|---|---|---|---|---|---|---|---|
| | | 100 | 200 | 400 | 800 | 1600 | 3200 | 6400 | 12800 | 25600 |
| FRAME RATE | 120fps | MODE B | MODE B | MODE A | MODE A | MODE A | MODE A | MODE A | MODE A | MODE A |
| | 60fps | MODE B | MODE B | MODE B | MODE A | MODE A | MODE A | MODE A | MODE A | MODE A |
| | 30fps | MODE B | MODE B | MODE B | MODE B | MODE A | MODE A | MODE A | MODE A | MODE A |
| | 15fps | MODE B | MODE B | MODE B | MODE B | MODE B | MODE A | MODE A | MODE A | MODE A |

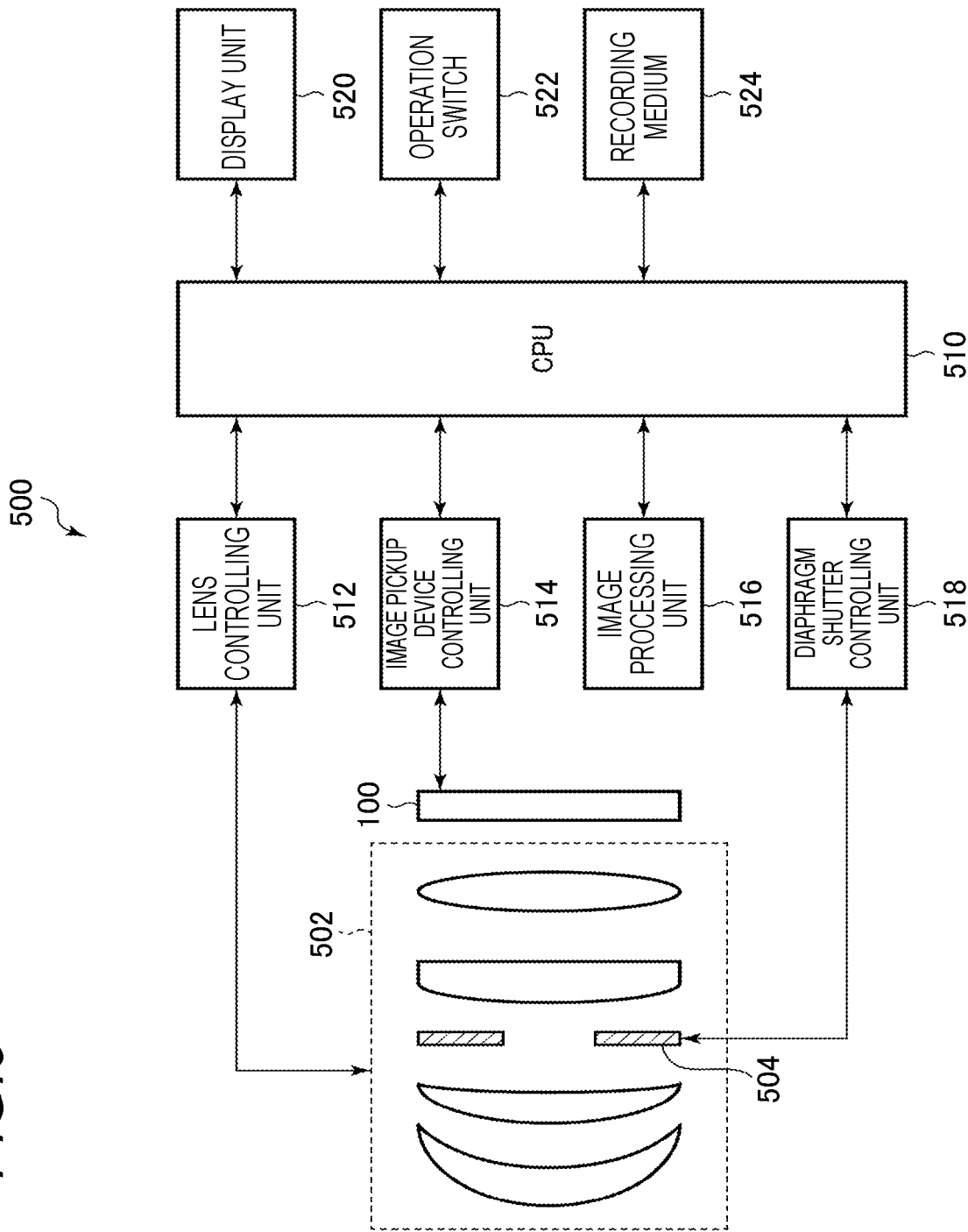

IMAGE PICKUP DEVICE, IMAGE PICKUP SYSTEM, AND MOVING APPARATUS

BACKGROUND OF THE INVENTION

Field of the Invention

The present invention relates to an image pickup device, and an image pickup system and a moving apparatus including the image pickup device.

Description of the Related Art

An image pickup device (also called "image pickup element" or "image sensor") that is mounted on an image pickup system, such as a digital camera, converts an analog signal obtained through photoelectric conversion into a digital signal by an AD converter, and outputs the digital signal. Japanese Patent Application Laid-open No. 2015-162751 discloses a technology that changes a column amplifier gain on the basis of the ISO speed setting of a camera, and changes the change rate of a ramp signal with respect to time on the basis of an incident light amount, thereby changing an AD conversion gain.

SUMMARY OF THE INVENTION

The inventor of the present invention has found that in a case where a column amplifier gain is switched on the basis of the ISO speed setting of a camera with the use of the related art, when the ISO speed is set high, image qualities may be deteriorated. This is because when the gain of the column amplifier is set high on the basis of how high the ISO speed is, the response of the amplifier drops and the settling time after gain switching thus increases, with the result that it is difficult to complete pixel signal readout operation in a desired period of time.

The present invention has been made in view of the above-mentioned problem, and has an object to provide an image pickup device capable of performing high-speed readout operation and obtaining high-quality images.

The present invention in its first aspect provides an image pickup device, comprising: a pixel configured to output a signal based on a light reception amount; and an AD conversion unit configured to obtain, by using a ramp signal, a digital value corresponding to the signal that is output from the pixel, the AD conversion unit including: an amplifier circuit configured to amplify the signal that is output from the pixel; a comparator circuit including an output node for outputting a comparison result signal generated by using an output signal from the amplifier circuit and the ramp signal; a memory configured to hold a digital value corresponding to the output signal, based on a result of the comparator circuit; a gain switching circuit configured to switch a gain of the amplifier circuit; and a ramp signal switching circuit configured to switch a slope of the ramp signal, the gain switching circuit and the ramp signal switching circuit being electrically connected to the output node.

The present invention in its second aspect provides an image pickup system, comprising: the image pickup device according to the present invention; and a signal processing unit configured to process a signal that is output from the image pickup device.

The present invention in its third aspect provides a moving apparatus, comprising: the image pickup device according to the present invention; a distance information obtaining unit configured to obtain distance information on distance to an object, from the signal that is output from the pixel of the image pickup device; and a control unit configured to control the moving apparatus based on the distance information.

According to the present invention, it is possible to provide the image pickup device capable of performing high-speed readout operation and obtaining high-quality images.

Further features of the present invention will become apparent from the following description of exemplary embodiments with reference to the attached drawings.

BRIEF DESCRIPTION OF THE DRAWINGS

FIG. 6 is a condition table of driving mode switching in the first embodiment;

FIG. 7 is a condition table of driving mode switching in a second embodiment;

FIG. 8 is a condition table of driving mode switching in a third embodiment;

FIG. 9 is a block diagram of an image pickup system according to a fourth embodiment;

DESCRIPTION OF THE EMBODIMENTS

First Embodiment (Image Pickup Device)

Figure 1:
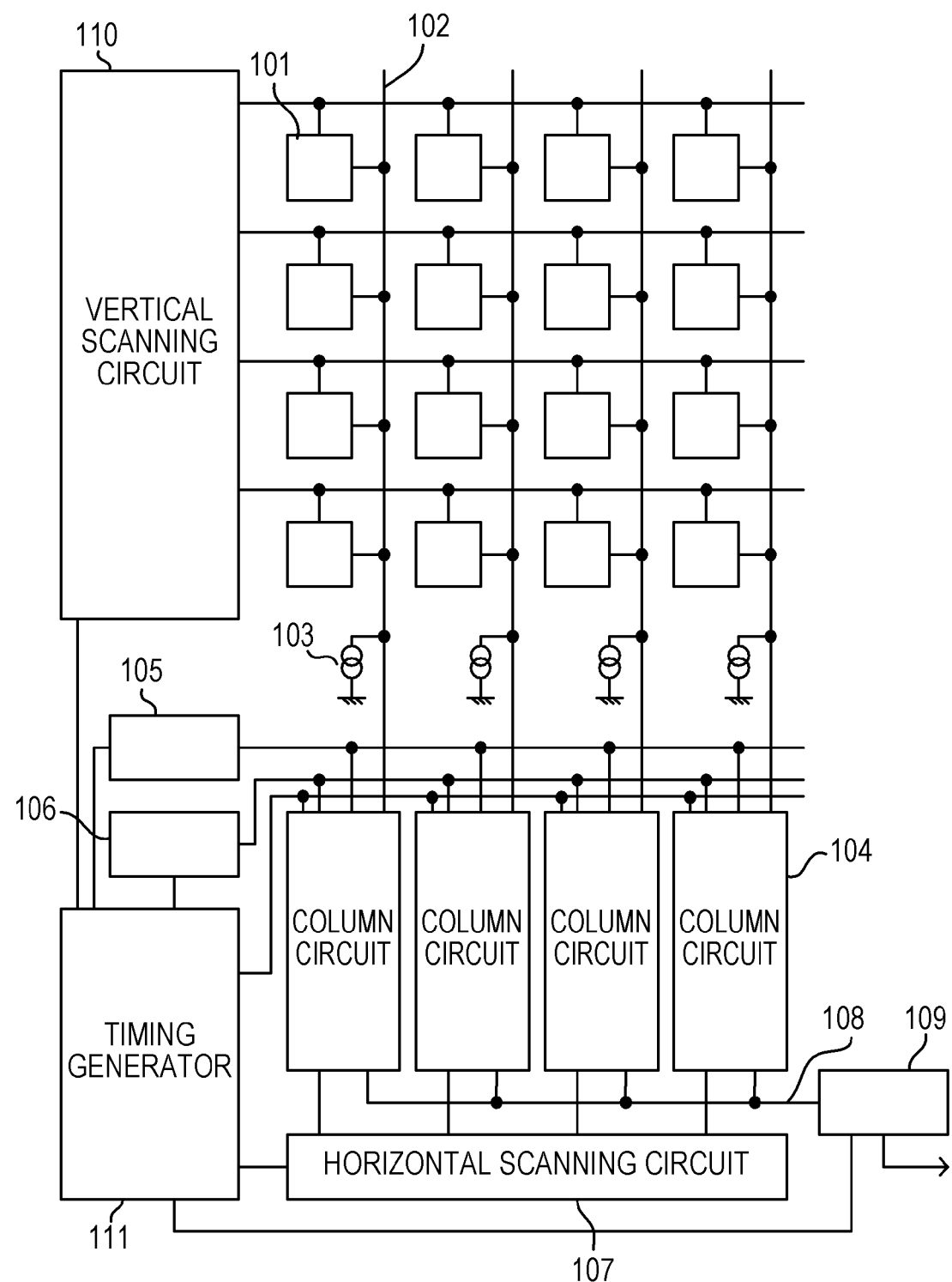
FIG. 1 is a block diagram of an image pickup device according to a first embodiment.

FIG. 1 is a block diagram illustrating an example of the configuration of an image pickup device (also called "photoelectric conversion device") according to a first embodiment of the present invention. The image pickup device of the present embodiment includes a plurality of pixels 101 arranged in a matrix. FIG. 1 illustrates an example in which 16 pixels 101 are arranged in four rows and four columns, but an actual image pickup device includes tens of millions of pixels 101 arranged. This image pickup device is a so-called CMOS image sensor.

The pixel 101 includes a photoelectric conversion portion configured to generate charges through photoelectric conversion, and converts the charges, which are generated by the photoelectric conversion portion, into a voltage signal to output the signal to a vertical output line 102. A pixel constant current source 103 is electrically connected to the vertical output line 102, and supplies current to the vertical output line 102. A column circuit 104 is provided to correspond to the column of the pixels 101. The output signals from the pixels 101 are input to the column circuit 104 via the vertical output line 102. The column circuit 104 is an AD conversion unit configured to amplify the pixel output signals and perform analog-to-digital conversion (AD conversion). A ramp signal output circuit 105 is a ramp signal supplying unit configured to generate ramp signals that are used in AD conversion, which is performed by the column circuit 104. The ramp signal is a signal whose potential is changed over time. In the present embodiment, the ramp signal having a constant slope (change rate) is used, but a ramp signal having a changing slope may be used. The ramp signal output circuit 105 can output a plurality of kinds of ramp signals having different slopes. A counter circuit 106 outputs a count signal CNT that is used in AD conversion, which is performed by the column circuit 104. The count signal CNT is a signal that counts clock pulse signals CLK that are supplied from a clock pulse supplying unit, which is not illustrated, from when the time-dependent change of the ramp signal, which is output from the ramp signal output circuit 105, is started. The signals that are obtained through AD conversion by the column circuit 104 are sequentially output to the outside of the image pickup device by a horizontal scanning circuit 107 via a horizontal output line 108 and a signal processing circuit 109. The vertical scanning circuit 110 performs operation of sequentially selecting predetermined rows. A timing generator 111 supplies drive signals to the vertical scanning circuit 110, the horizontal scanning circuit 107, the column circuits 104, the ramp signal output circuit 105, and the counter circuit 106. Further, the timing generator 111 also provides a function of a mode switching unit configured to obtain, from an external circuit (for example, a control unit of the image pickup system), the setting values of imaging conditions (ISO speed and a frame rate, for example), and perform switching of a driving mode, which is described later, on the basis of the imaging conditions.

(Configuration of Pixel)

Figure 2:
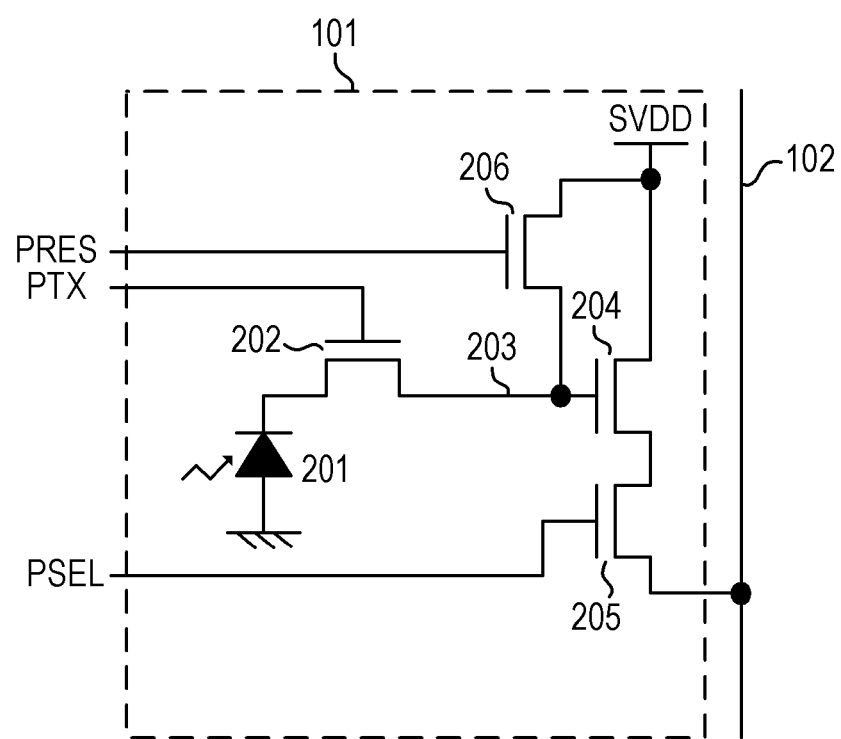
FIG. 2 is an equivalent circuit diagram of a pixel according to the first embodiment.

FIG. 2 is a diagram illustrating an example of the circuit configuration of the pixel 101 according to the present embodiment. In the pixel 101, a photoelectric conversion portion 201 converts incident light into charges to accumulate the charges. Here, a photodiode is illustrated as an example. A transfer MOS transistor 202 transfers the charges accumulated in the photoelectric conversion portion 201 to a floating diffusion (hereinafter referred to as "FD") 203. The FD 203 converts the transferred charges into voltage. When a selection MOS transistor 205 is turned on, an amplifier MOS transistor 204 amplifies the voltage signal generated in the FD 203 and outputs the signal to the vertical output line 102. A reset MOS transistor 206 resets the potential of the FD 203 and the potential of the photoelectric conversion portion 201 to SVDD via the transfer MOS transistor 202. The transfer MOS transistor 202, the reset MOS transistor 206, and the selection MOS transistor 205 are each connected to the vertical scanning circuit 110, and are controlled with control signals PTX, PRES, and PSEL.

(Configuration of Column Circuit)

Figure 3:
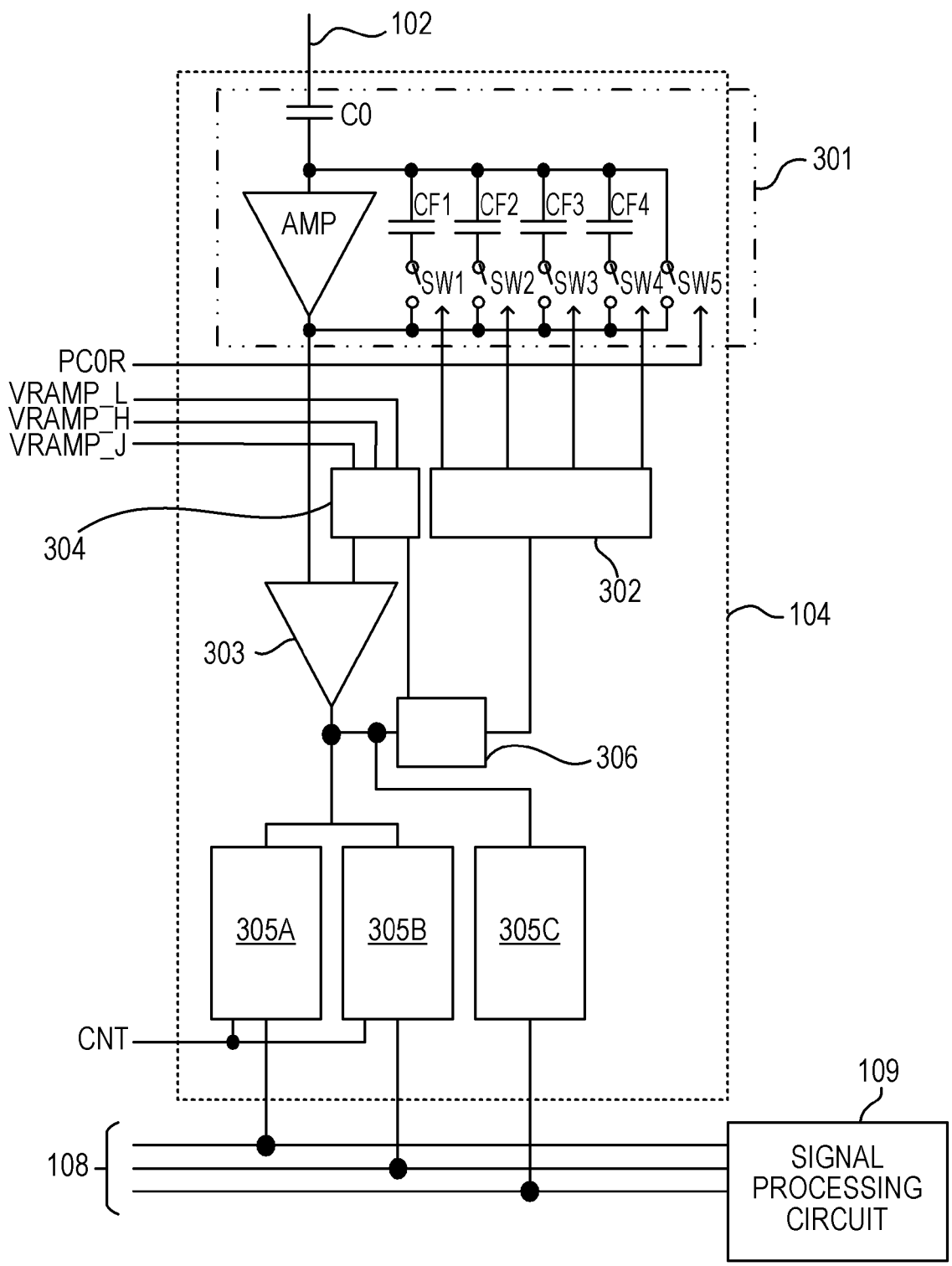
FIG. 3 is an equivalent circuit diagram of a column circuit according to the first embodiment.

FIG. 3 is a diagram illustrating an example of the circuit configuration of the column circuit 104 according to the present embodiment. A pixel output signal PIXOUT that is output from the pixel 101 is input to a column amplifier 301 via the vertical output line 102.

The column amplifier 301 is an amplifier circuit. The column amplifier 301 amplifies the pixel output signal PIXOUT on the basis of a gain setting result of a gain switching circuit 302, and outputs the signal to a comparator 303. The column amplifier 301 includes an amplifier AMP, an input capacitor C0, feedback capacitors Cf1, Cf2, Cf3, and Cf4, and switches SW1, SW2, SW3, SW4, and SW5. The switches SW1 to SW4 are controlled by the gain switching circuit 302. The switch SW5 is controlled with a C0 reset pulse PC0R. The gain of the column amplifier 301 is determined on the basis of the ratio between the capacitance values of active feedback capacitors Cf on the feedback path of the amplifier AMP and the capacitance value of the input capacitor C0. The details of the operation of the gain switching circuit 302 are described later.

To one input of the comparator 303, the ramp signal that is supplied from the ramp signal output circuit 105, which is illustrated in FIG. 1, is input on the basis of the selection result of the ramp signal switching circuit 304. The details of the operation of the ramp signal switching circuit 304 are described later. To the other input of the comparator 303, the output signal from the column amplifier 301 is input.

The comparator 303 is a comparator circuit. The comparator 303 generates a comparison result signal by using a column amplifier output signal AMPOUT that is input from the column amplifier 301 and a signal VRAMP that is supplied from the ramp signal output circuit 105, and outputs the comparison result signal to its output node. Specifically, the comparator 303 outputs a low level when the voltage of the signal VRAMP is lower than the voltage of the signal AMPOUT, and outputs a high level when the voltage of the signal VRAMP is higher than the voltage of the signal AMPOUT.

The counter circuit 106 outputs the count signal CNT that counts the clock pulse signals CLK that are supplied from the clock pulse supplying unit, which is not illustrated, from when the time-dependent change of the signal VRAMP from the ramp signal output circuit 105 is started. That is, the counter circuit 106 counts the clock pulse signals CLK in parallel to the change of the potential of the signal VRAMP, and generates and outputs the count signal CNT. The count signal CNT is supplied to both of an N memory 305A and an S memory 305B in each column. The N memory 305A and the S memory 305B hold the count signal CNT, which is supplied from the counter circuit 106, when the signal value of an output COMPOUT that is supplied from the comparator 303 is changed from the low level to the high level.

The N memory 305A holds a digital signal that is obtained by performing AD conversion on a signal at a reset level of the FD 203 (hereinafter referred to as "N signal"). The S memory 305B holds a digital signal that is obtained by performing AD conversion on a signal that is obtained by superimposing a signal from the photoelectric conversion portion 201 on the N signal of the FD 203 (hereinafter referred to as "S signal"). A determination value memory 305C holds a result (hereinafter referred to as "J signal") that is obtained by comparing and determining, by the comparator 303, a reference voltage VREF generated with the ramp signal VRAMP, and the output from the column amplifier 301. The J signal is also input to the selection circuit 306, and the selection circuit 306 outputs the J signal to one of the ramp signal switching circuit 304 and the gain switching circuit 302. The details of the operation of the selection circuit 306 are described later.

The signals held by the N memory 305A, the S memory 305B, and the determination value memory 305C are output to the signal processing circuit 109 via the horizontal output line 108, with control signals from the horizontal scanning circuit 107. Then, the signal processing circuit 109 subtracts the N signal from the S signal, and outputs a signal from which noise components are removed. The details of the processing by the signal processing circuit 109 are described later.

The gain switching circuit 302 and the ramp signal switching circuit 304 are connected to the output node of the comparator 303 via the selection circuit 306. It can be said that this state is a state in which the gain switching circuit 302 and the ramp signal switching circuit 304 are electrically connected to the comparator 303. Elements other than the selection circuit 306 (for example, resistance elements, capacitance elements, or logic circuits) may be provided on the electrical path between the gain switching circuit 302 and the output node of the comparator 303, and the electrical path between the ramp signal switching circuit 304 and the output node of the comparator 303. The case where the elements other than the selection circuit 306 are provided on the electrical paths in this way is also included in the example in which each of the switching circuits 302 and 304 and the output node of the comparator 303 are electrically connected to each other. In other words, it can be said that the configuration in which the output node of the comparator 303 and the gain switching circuit 302 are electrically connected to each other is a configuration in which the signal from the output node of the comparator 303 is input to the gain switching circuit 302. Further, it can be said that the configuration in which the output node of the comparator 303 and the ramp signal switching circuit 304 are electrically connected to each other is a configuration in which the signal from the output node of the comparator 303 is input to the ramp signal switching circuit 304. Further, to the output node of the comparator 303, the N memory 305A, the S memory 305B, and the determination value memory 305C are also electrically connected. Other elements may also be provided on the electrical path between the output node of the comparator 303 and each memory.

The image pickup device of the present embodiment can perform two types of pixel signal readout operation. One operation mode is a mode in which AD conversion is performed with the ramp signal having a slope that is switched on the basis of the magnitude of the signal (signal output level) that is output from the pixel 101. The other operation mode is a mode in which AD conversion is performed with a column amplifier gain that is switched on the basis of the signal output level of the pixel 101. The former operation mode is referred to as "driving mode A" and the latter operation mode is referred to as "driving mode B".

(Driving Mode A)

First, there is described the operation in which AD conversion is performed with the ramp signal having a slope that is switched on the basis of the signal output level of the pixel 101.

Figure 4:
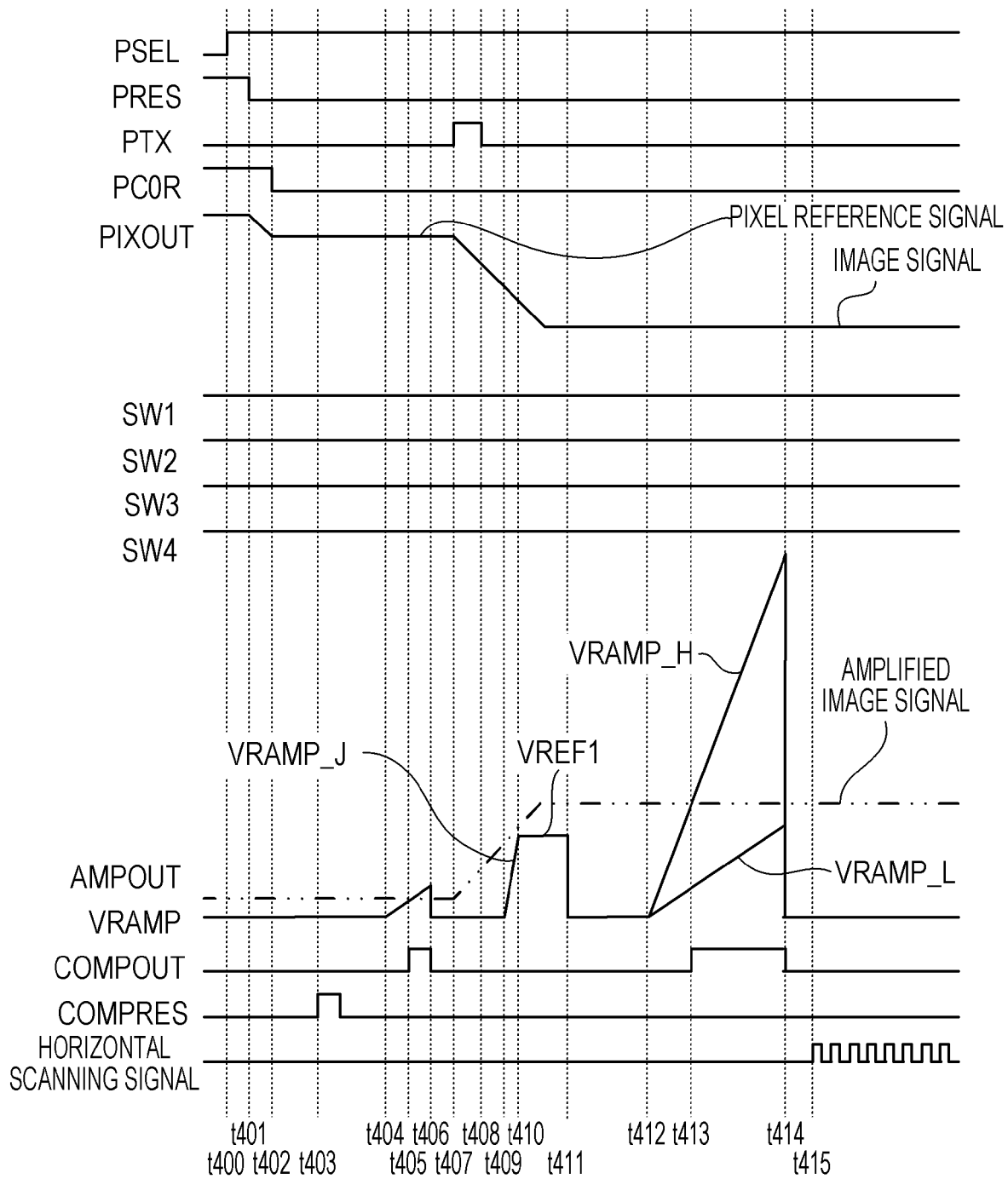
FIG. 4 is an operation timing chart of a driving mode A of the image pickup device according to the first embodiment.

FIG. 4 is a timing chart illustrating an example of charge readout operation. FIG. 4 schematically illustrates the timing of each drive pulse, the pixel output voltage, the column amplifier output voltage, and the ramp signal.

At time t400, the vertical scanning circuit 110 sets the selection pulse PSEL to the high level, and selects the row of the pixels 101 each of which is to output the pixel signal PIXOUT. Further, the vertical scanning circuit 110 sets the reset pulse PRES to the high level to reset the potential of the FD 203.

At time t401, the vertical scanning circuit 110 sets the reset pulse PRES to the low level. The pixel signal PIXOUT that is output when the reset pulse PRES is set to the low level is referred to as "pixel reference signal". The pixel reference signal is a signal containing noise components of the pixel 101.

At time t402, the horizontal scanning circuit 107 changes the C0 reset pulse PC0R from the high level to the low level, and releases the amplifier AMP and the input capacitor C0 from reset. With this, the input capacitor C0 holds charges based on the potential of the pixel reference signal when the C0 reset pulse PC0R is set to the low level, and the column amplifier 301 outputs the column amplifier output signal AMPOUT.

At time t403, the horizontal scanning circuit 107 sets a comparator reset pulse COMPRES to the high level, and sets the comparator reset pulse COMPRES to the low level after a predetermined period of time has elapsed. The comparator reset pulse COMPRES is used for resetting and initializing the comparator 303.

In a period from time t404 to time t406, the potential of a ramp signal VRAMP_L is increased from its initial value depending on time by the ramp signal output circuit 105. The ramp signal output circuit 105 can simultaneously output a plurality of ramp signals having different slopes, that is, VRAMP_L having a small slope, VRAMP_H having a large slope, and VRAMP_J having the largest slope, and input the signals to the column circuit 104. Here, however, only VRAMP_L is input to the comparator 303 via the ramp signal switching circuit 304. When the ramp signal VRAMP_L is used as a reference voltage, as compared to a case where VRAMP_H is used as the reference voltage, the potential change amount of the ramp signal per unit of time is small, and hence high-resolution AD conversion can be performed. The driving described above is achieved by the timing generator 111 transmitting control signals to the ramp signal output circuit 105 and the ramp signal switching circuit 304.

At time t404, the change of the potential of the ramp signal VRAMP_L is started, and the counter circuit 106 starts counting the clock pulse signals to supply the count signal CNT to the N memory 305A in each column. At time t405, the voltage of the signal VRAMP_L exceeds the column amplifier output signal AMPOUT, and the signal value of COMPOUT that is output from the comparator 303 is changed. The value of the count signal CNT (count value) at this time is held by the N memory 305A. The value of the count signal CNT that is held by the N memory 305A at this time is a digital value that is obtained by performing AD conversion on the N signal. At time t406, the time-dependent change of the potential of the ramp signal VRAMP_L is stopped. The state is reset to the state at time t400. The counter circuit 106 stops counting the clock pulse signals, and returns the count signal CNT to its initial value.

At time t407, the transfer pulse PTX is set to the high level, and at time t408, the transfer pulse PTX is set to the low level. With this, signal charges that are generated with light entering the photoelectric conversion portion 201 are transferred to the FD 203. The amplifier MOS transistor 204 outputs the voltage signal based on the signal charges transferred to the FD 203. This voltage signal is output to the vertical output line 102 via the selection MOS transistor 205. This signal is an image signal that is one type of the pixel signal PIXOUT. The image signal is an analog signal having voltage corresponding to the light reception amount of the photoelectric conversion portion 201 in one frame period.

The column amplifier 301 outputs the column amplifier output signal AMPOUT that is obtained by inverting and amplifying a voltage difference between the pixel reference signal and the image signal. The column amplifier output signal AMPOUT at this time is referred to as "amplified image signal". The amplified image signal is input to one input of the comparator 303.

In a period from time t409 to time t411, the ramp signal VRAMP_J is input to the other input of the comparator 303. The ramp signal VRAMP_J is generated by the ramp signal output circuit 105 to be input to the comparator 303 via the ramp signal switching circuit 304.

In a period between time t409 and time t410, the potential of the ramp signal VRAMP_J is increased from its initial value depending on time by the ramp signal output circuit 105. At time t410, the change of the potential of the ramp signal VRAMP_J is stopped. The voltage of the ramp signal VRAMP_J at time t410 is a reference voltage VREF1. This reference voltage VREF1 is used as a threshold for determining whether the image signal is a low luminance signal or a high luminance signal.

In a period between time t410 and time t411, the comparator 303 compares the reference voltage VREF1 and the column amplifier output signal AMPOUT to each other. When the voltage of the column amplifier output signal AMPOUT is lower than the reference voltage VREF1, COMPOUT (second comparison result signal) that is the output from the comparator 303 is changed from the low level to the high level (=1). The output COMPOUT is also input to the selection circuit 306. In this operation mode, the selection circuit 306 outputs a switching signal to the ramp signal switching circuit 304, and the ramp signal switching circuit 304 selects the ramp signal VRAMP_L to input the ramp signal VRAMP_L to the comparator 303. In short, when the image signal is a low luminance signal, the first ramp signal VRAMP_L having a relatively small slope is used in AD conversion.

When the voltage of the column amplifier output signal AMPOUT is higher than the reference voltage VREF1, COMPOUT (second comparison result signal) that is the output from the comparator 303 is set to the low level (=0). The selection circuit 306 outputs the switching signal to the ramp signal switching circuit 304, and the ramp signal switching circuit 304 selects the ramp signal VRAMP_H to input the ramp signal VRAMP_H to the comparator 303. In short, when the image signal is a high luminance signal, the second ramp signal VRAMP_H having a larger slope than the first ramp signal VRAMP_L is used in AD conversion.

In the period between time t410 and time t411, the value of the output COMPOUT (hereinafter referred to as "determination value J") from the comparator 303 is input to the selection circuit 306. Further, the determination value J is also held by the determination value memory 305C (second memory). This determination value J is a flag representing whether the image signal is a low luminance signal (J=1) or a high luminance signal (J=0).

At time t411, the determination on which signal of the ramp signals VRAMP_H and VRAMP_L is used in the S signal AD conversion period is complete, and the potential of the ramp signal VRAMP_J is reset.

In a period from time t412 to time t414, the ramp signal output circuit 105 increases the potential of the ramp signal VRAMP_L and the potential of the ramp signal VRAMP_H from their initial values depending on time. Whether each of the column circuits 104 inputs VRAMP_L or VRAMP_H to the comparator 303 is determined on the basis of the value of COMPOUT in the period between time t410 and time t411. In the case of FIG. 4, the column amplifier output signal AMPOUT in the period between time t410 and time t411 is larger than the reference voltage VREF1, and hence the ramp signal VRAMP_H having a relatively large slope is selected.

At time t412, the change of the potential of the ramp signal VRAMP_H is started, and the counter circuit 106 starts counting the clock pulse signals to supply the count signal CNT to the S memory 305B in each column.

At time t413, the voltage of the signal VRAMP_H exceeds the column amplifier output signal AMPOUT, and the signal value of COMPOUT that is output from the comparator 303 is changed. The value of the count signal CNT (count value) at this time is held by the S memory 305B. The value of the count signal CNT that is held by the S memory 305B at this time is a digital value that is obtained by performing AD conversion on the S signal.

At time t414, the time-dependent change of the potentials of the ramp signal VRAMP_L and the ramp signal VRAMP_H is stopped. The state is reset to the state at time t400. The counter circuit 106 stops counting the clock pulse signals, and returns the count signal CNT to its initial value.

After time t415, the column circuits 104 are sequentially operated by the horizontal scanning circuit 107 so that the signals held by the N memory 305A, the S memory 305B, and the determination value memory 305C are transmitted to the signal processing circuit 109 via the horizontal output line 108. Then, after being subjected to arithmetic processing, the signals are output to the outside of the image pickup device.

The signal processing circuit 109 calculates a differential signal level (light component) by subtracting the N signal from the S signal. Before the calculation of subtracting the N signal from the S signal, AD conversion result correcting processing is performed with the ramp signal selected in AD conversion of the S signal.

Here, the AD conversion result correcting processing is described. For example, when the slope of the ramp signal VRAMP_H is four times as large as the slope of the ramp signal VRAMP_L, the signal amplitude of VRAMP_H that corresponds to one count of the count signal CNT is four times as large as that of VRAMP_L. In view of this, in order to achieve the same digital output with respect to the potential levels of the signals, the processing of multiplying the count value obtained through AD conversion with VRAMP_H by four is performed with a digital gain. Whether the S signal that is input to the signal processing circuit 109 needs the correction processing can be determined with the determination value J held by the determination value memory 305C. When the determination value J is zero, the ramp signal VRAMP_H is selected, and hence the processing of multiplying the S signal by four is performed, whereas when J=1 is satisfied, the ramp signal VRAMP_L is selected, and hence the processing of multiplying the S signal by four is not performed.

The threshold (the level of the reference voltage VREF1) that is used for obtaining the determination value J can be set to any value. When the slope of the ramp signal VRAMP_H is four times as large as the slope of the ramp signal VRAMP_L, however, the threshold may be set to ¼ of the amplitude of an output signal to be subjected to AD conversion. For example, when the amplitude of an output signal to be subjected to AD conversion is 1 [V], VREF1 is set to a value equivalent to an amplitude of 0.25 [V]. The counter is configured to count up to 12 bits, that is, 4095 in AD conversion, and the ramp signal VRAMP_L is controlled to have an amplitude of 0.25 [V] at 4095 counts. Meanwhile, the ramp signal VRAMP_H is controlled to have an amplitude of 1 [V] at 4095 counts.

When AD conversion is performed with such a configuration, the results after the correction processing are as follows: for the output when the amplitude is a small amplitude of 0.25 [V] or smaller, that is, when the luminance is low, output results are obtained in units of one count from 0 to 4095; and for the output when the amplitude is a large amplitude that is larger than 0.25 [V] and is 1 [V] or smaller, that is, when the luminance is high, output results are obtained in units of four counts from 4096 to 16380. In this way, although the resolution of high luminance output is lower than that of low luminance output, AD conversion can be performed at high speed in a short period of time up to the count equivalent to 14 bits.

(Driving Mode B)

Next, there is described another pixel signal readout operation, specifically an operation for performing AD conversion by switching the column amplifier gain on the basis of the signal output level of the pixel 101.

Figure 5:
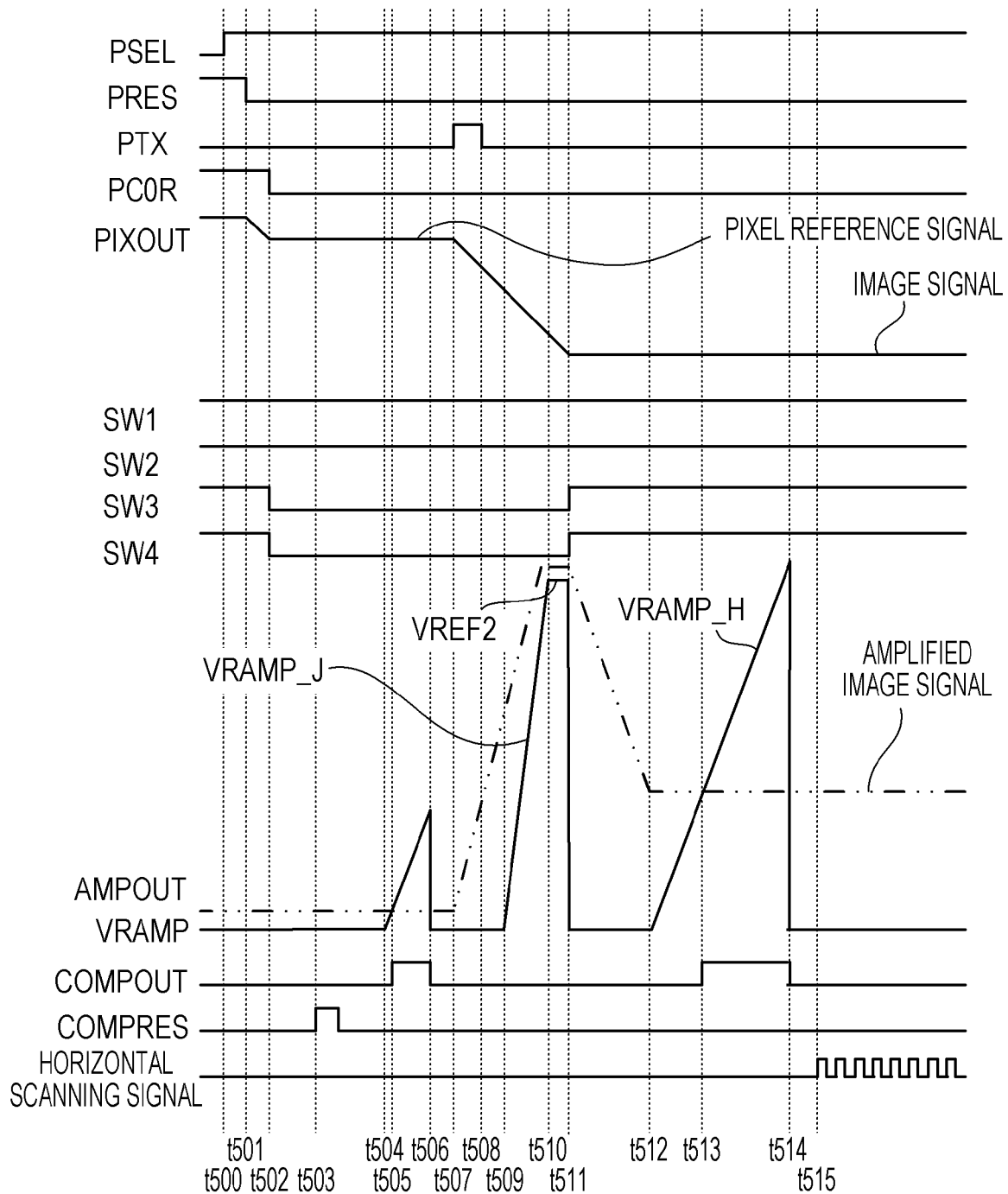
FIG. 5 is an operation timing chart of a driving mode B of the image pickup device according to the first embodiment.

FIG. 5 is a timing chart illustrating an example of the charge readout operation. FIG. 5 schematically illustrates the timing of each drive pulse, the pixel output voltage, the column amplifier output voltage, and the ramp signal.

At time t500, the vertical scanning circuit 110 sets the selection pulse PSEL to the high level, and selects the row of the pixels 101 each of which is to output the pixel signal PIXOUT. Further, the vertical scanning circuit 110 sets the reset pulse PRES to the high level to reset the potential of the FD 203.

At time t501, the vertical scanning circuit 110 sets the reset pulse PRES to the low level. The pixel signal PIXOUT that is output when the reset pulse PRES is set to the low level is referred to as "pixel reference signal". The pixel reference signal is a signal containing noise components of the pixel 101.

At time t502, the horizontal scanning circuit 107 changes the C0 reset pulse PC0R from the high level to the low level, and releases the amplifier AMP and the input capacitor C0 from reset. With this, the input capacitor C0 holds the charges based on the potential of the pixel reference signal when the C0 reset pulse PC0R is set to the low level. Further, the switches SW3 and SW4 are turned off so that the column amplifier 301 outputs the column amplifier output signal AMPOUT by using only the feedback capacitors Cf1 and Cf2.

The column amplifier gain is determined on the basis of the ratio between the capacitance values of the feedback capacitors Cf1, Cf2, Cf3, and Cf4, which are connected to the feedback path of the amplifier AMP, and the capacitance value of the input capacitor C0. In the present embodiment, the capacitance values of Cf1, Cf2, Cf3, and Cf4 are ⅛ times, ⅛ times, ¼ times, and ½ times as large as the capacitance value of the input capacitor C0. A gain when the feedback capacitors Cf1, Cf2, Cf3, and Cf4 are all used is 1/(⅛+⅛+¼+½)=one-fold gain. A gain when the feedback capacitors Cf1 and Cf2 are only used is 1/(⅛+⅛)=four-fold gain.

At time t503, the horizontal scanning circuit 107 sets the comparator reset pulse COMPRES to the high level, and sets the comparator reset pulse COMPRES to the low level after a predetermined period of time has elapsed.

In a period from time t504 to time t506, the potential of the ramp signal VRAMP_H is increased from its initial value depending on time by the ramp signal output circuit 105. Here, only VRAMP_H is input to the comparator 303 via the ramp signal switching circuit 304. For example, in a case where the slope of the ramp signal VRAMP_H is four times as large as the slope of the ramp signal VRAMP_L, when the AD conversion gain for VRAMP_L is the one-fold gain, the AD conversion gain for VRAMP_H is a ¼-fold gain because the potential change amount of the ramp signal VRAMP_H per unit of time is large. Although the details are described later, when the luminance is low and the four-fold column amplifier gain is used, the ¼-fold AD conversion gain is used for VRAMP_H so that a digital value after AD conversion with respect to an optical signal is made appropriate. The driving described above is achieved by the timing generator 111 transmitting control signals to the ramp signal output circuit 105 and the ramp signal switching circuit 304.

At time t504, the change of the potential of the ramp signal VRAMP_H is started, and the counter circuit 106 starts counting the clock pulse signals to supply the count signal CNT to the N memory 305A in each column. At time t505, the voltage of the signal VRAMP_H exceeds the column amplifier output signal AMPOUT, and the signal value of COMPOUT that is output from the comparator 303 is changed. The value of the count signal CNT at this time is held by the N memory 305A. The value of the count signal CNT that is held by the N memory 305A at this time is the value that is obtained by performing AD conversion on the N signal. At time t506, the time-dependent change of the potential of the ramp signal VRAMP_H is stopped. The state is reset to the state at time t500. The counter circuit 106 stops counting the clock pulse signals, and returns the count signal CNT to its initial value.

At time t507, the transfer pulse PTX is set to the high level, and at time t508, the transfer pulse PTX is set to the low level. With this, signal charges that are generated with light entering the photoelectric conversion portion 201 are transferred to the FD 203. The amplifier MOS transistor 204 outputs the voltage signal based on the signal charges transferred to the FD 203. This voltage signal is output to the vertical output line 102 via the selection MOS transistor 205. This signal is the image signal that is one type of the pixel signal PIXOUT.

The column amplifier 301 outputs the column amplifier output signal AMPOUT that is obtained by inverting and amplifying a voltage difference between the pixel reference signal and the image signal. The column amplifier output signal AMPOUT at this time is referred to as "amplified image signal". The amplified image signal is input to one input of the comparator 303.

In a period from time t509 to time t511, the ramp signal VRAMP_J is input to the other input of the comparator 303. The ramp signal VRAMP_J is generated by the ramp signal output circuit 105 to be input to the comparator 303 via the ramp signal switching circuit 304.

In a period between time t509 and time t510, the potential of the ramp signal VRAMP_J is increased from its initial value depending on time by the ramp signal output circuit 105. At time t510, the change of the potential of the ramp signal VRAMP_J is stopped. The voltage of the ramp signal VRAMP_J at time t510 is a reference voltage VREF2. This reference voltage VREF2 is used as a threshold for determining whether the image signal is a low luminance signal or a high luminance signal.

In a period between time t510 and time t511, the comparator 303 compares the reference voltage VREF2 and the column amplifier output signal AMPOUT to each other. When the voltage of the column amplifier output signal AMPOUT is lower than the reference voltage VREF2, COMPOUT (second comparison result signal) that is the output from the comparator 303 is changed from the low level to the high level (=1). The output COMPOUT is also input to the selection circuit 306. In this operation mode, the selection circuit 306 outputs the switching signal to the gain switching circuit 302, and the gain switching circuit 302 inputs a gain switching signal to the column amplifier 301. When the voltage of the signal AMPOUT is lower than the reference voltage VREF2, the switches SW1 to SW4 are not changed, and the gain is the four-fold gain.

When the voltage of the signal AMPOUT is higher than the reference voltage VREF2, COMPOUT (second comparison result signal) that is the output from the comparator 303 is set to the low level (=0). The selection circuit 306 outputs the switching signal to the gain switching circuit 302 and the switches SW3 and SW4 are turned on. The gain is switched to the one-fold gain, and a signal amplified by one is thus output.

In the period between time t510 and time t511, the value of the output COMPOUT (determination value J) from the comparator 303 is input to the selection circuit 306. Further, the determination value J is also held by the determination value memory 305C (second memory).

At time t511, the determination on which of the one-fold column amplifier gain and the four-fold column amplifier gain is used in the S signal AD conversion period is complete, and the potential of the ramp signal VRAMP_J is reset.

In a period from time t512 to time t514, the ramp signal output circuit 105 increases the potential of the ramp signal VRAMP_H from its initial value depending on time. In the case of FIG. 5, in the period between time t510 and time t511, the voltage of the column amplifier output signal AMPOUT is larger than the reference voltage VREF2, and hence the column amplifier gain is switched to the one-fold gain.

At time t512, the change of the potential of the ramp signal VRAMP_H is started, and the counter circuit 106 starts counting the clock pulse signals to supply the count signal CNT to the S memory 305B in each column.

At time t513, the voltage of the signal VRAMP_H exceeds the column amplifier output signal AMPOUT, and the signal value of COMPOUT that is output from the comparator 303 is changed. The signal value of the count signal CNT at this time is held by the S memory 305B. The signal value of the count signal CNT that is held by the S memory 305B at this time is the value that is obtained by performing AD conversion on the S signal.

At time t514, the time-dependent change of the potential of the ramp signal VRAMP_H is stopped. The state is reset to the state at time t500. The counter circuit 106 stops counting the clock pulse signals, and returns the count signal CNT to its initial value.

After time t515, the column circuits 104 are sequentially operated by the horizontal scanning circuit 107 so that the signals held by the N memory 305A, the S memory 305B, and the determination value memory 305C are transmitted to the signal processing circuit 109 via the horizontal output line 108. Then, after being subjected to the arithmetic processing, the signals are output to the outside of the image pickup device.

The signal processing circuit 109 calculates a differential signal level (light component) by subtracting the N signal from the S signal. Before the calculation of subtracting the N signal from the S signal, the AD conversion result correcting processing is performed with the column amplifier gain used in AD conversion of the S signal.

Here, the AD conversion result correcting processing is described. Whether the S signal that is input to the signal processing circuit 109 needs the correction processing is determined with the determination value J held by the determination value memory 305C. When the determination value J is zero, the column amplifier gain is changed from the four-fold gain to the one-fold gain, and hence the processing of multiplying the S signal by four is performed. When J=1 is satisfied, the column amplifier gain is unchanged from the four-fold gain, and hence the processing of multiplying the S signal by four is not performed.

The threshold (the level of the reference voltage VREF2) that is used for obtaining the determination value J can be set to any value. When the amplitude of an output signal to be subjected to AD conversion is 1 [V], for example, the reference voltage VREF2 may be set to a value equivalent to an amplitude of 1 [V]. The counter is configured to count up to 12 bits, that is, 4095 in AD conversion, and the ramp signal VRAMP_H is controlled to have an amplitude of 1 [V] at 4095 counts.

For the output when AD conversion is performed with the four-fold column amplifier gain, that is, when the luminance is low, output results are obtained in units of one count from 0 to 4095. For the output when AD conversion is performed with the column amplifier gain that is changed from the four-fold column amplifier gain to the one-fold column amplifier gain, that is, when the luminance is high, output results are obtained in units of four counts from 4096 to 16380. In this way, although the resolution of high luminance output is lower than that of low luminance output, AD conversion can be performed at high speed in a short period of time up to the count equivalent to 14 bits.

Incidentally, it is generally known that when the ISO speed of an image pickup device is changed, the gain of a column amplifier is accordingly switched to be used. For example, when a one-fold column amplifier gain is used for ISO 100, a two-fold column amplifier gain is used for ISO 200 and a four-fold column amplifier gain is used for ISO 400.

At ISO 100 in the driving mode B of the present embodiment, when the luminance is high, shot noise that is generated in proportion to the amount of light is more dominant than circuit noise, and hence the one-fold column amplifier gain is used. When the luminance is low, on the other hand, circuit noise is dominant, and hence the four-fold column amplifier gain is used, and the column amplifier amplifies a signal with the gain. With this, the effect of noise that is generated at the comparator, which is provided in the latter stage, is relatively reduced, and high-quality images can be obtained. The effect of reducing random noise can thus be obtained from ISO 100.

(Switching of Driving Mode)

The driving mode B has an advantage that the random noise when the luminance is low is reduced, but has a disadvantage that switching operation with a high gain is needed when the ISO speed is high. For example, when the gain is set in proportion to the ISO speed, at ISO 25600, there is a need for switching to high gains, that is, a 64-fold gain for low luminance and a 16-fold gain for high luminance. When the gain is high, the response of the amplifier drops and the settling time increases, with the result that it is difficult to complete the pixel signal readout operation in a desired period of time. The driving mode A, on the other hand, has an advantage in increasing the speed because there is no need to wait until the settling time of the amplifier has elapsed.

In view of this, in the present embodiment, the driving mode is switched between the driving modes A and B on the basis of the ISO speed to be set. Specifically, when the ISO speed is higher than predetermined sensitivity, the driving mode is switched to the driving mode A to increase the speed of pixel signal readout, and otherwise, the driving mode is switched to the driving mode B to reduce the random noise.

Next, a specific example in which the driving mode is changed on the basis of the ISO speed setting is described. FIG. 6 is a table illustrating a relationship between the ISO speed, the driving mode, the column amplifier gain, and the ramp gain (the slope of the ramp signal) in the present embodiment. In the present embodiment, the driving mode B is used when the ISO speed is 100 or 200, and the driving mode A is used when the ISO speed is from 400 to 25600. At ISO 100 or ISO 200, AD conversion is performed with the column amplifier gain that is switched between low luminance and high luminance, and the ramp gain that is fixed to the ¼-fold gain. From ISO 400 to ISO 25600, the column amplifier gain is fixed for each ISO speed, and the ramp gain (the slope of the ramp signal) is switched between low luminance and high luminance. The driving mode is switched referring to the setting table of FIG. 6 so that the random noise can be reduced when the ISO speed is set low, and when the ISO speed is set high, the readout speed can be increased even when the column amplifier performs amplification with a high gain.

Second Embodiment

A second embodiment of the present invention is described. While the driving mode is switched on the basis of the ISO speed setting in the first embodiment, in the present embodiment, the driving mode is switched on the basis of a frame rate. Specifically, when the frame rate is higher than a predetermined frame rate, the driving mode is switched to the driving mode A to increase the speed of pixel signal readout, and otherwise the driving mode is switched to the driving mode B to reduce the random noise. The configuration and the driving method of the image pickup device are the same as those in the first embodiment, and hence description thereof is omitted.

FIG. 7 is a setting table of driving mode switching conditions. In the example of FIG. 7, at relatively low frame rates such as 15 fps (frame/sec) and 30 fps, the driving mode B is used to reduce the random noise. At relatively high frame rates such as 60 fps, 120 fps, and 240 fps, on the other hand, the driving mode A enabling high-speed readout is used. The driving mode is appropriately switched depending on the imaging conditions in this way, and high-quality images can therefore be obtained at any frame rate.

Third Embodiment

A third embodiment of the present invention is described. In the present embodiment, the driving mode is switched on the basis of the ISO speed setting and the frame rate. The configuration and the driving method of the image pickup device are the same as those in the first embodiment, and hence description thereof is omitted.

FIG. 8 is a setting table of driving mode switching conditions. In the example of FIG. 8, when the ISO speed is higher than first sensitivity (ISO 1600) (when the ISO speed is from ISO 3200 to ISO 25600), the driving mode is switched to the driving mode A. Further, when the ISO speed is lower than second sensitivity (ISO 400) (when the ISO speed is from ISO 100 to ISO 200), the driving mode is switched to the driving mode B. Further, in a case where the ISO speed is at least the second sensitivity and not more than the first sensitivity (when the ISO speed is from ISO 400 to ISO 1600), the driving mode is switched to the driving mode B when the frame rate is high, and is switched to the driving mode A when the frame rate is low.

In this way, the image pickup device is driven in the driving mode A enabling high-speed readout in a high-speed mode such as 120 fps, and is driven in the driving mode B up to ISO 1600 in a low-speed mode such as 15 fps to reduce the random noise. The driving mode is appropriately switched on the basis of the imaging conditions so that high-resolution images can be obtained.

Fourth Embodiment

An image pickup system according to a fourth embodiment of the present invention is described with reference to FIG. 9. FIG. 9 is a block diagram illustrating the schematic configuration of the image pickup system according to the present embodiment.

The image pickup devices according to the first to third embodiments described above are applicable to various image pickup systems. Image pickup systems to which the image pickup devices are applicable are not particularly limited and include, for example, digital still cameras, digital camcorders, monitoring cameras, copying machines, facsimiles, cell phones, vehicle-mounted cameras, and observation satellites. Further, the image pickup systems also include camera modules each including an optical system, such as a lens, and an image pickup device. FIG. 9 is a block diagram illustrating a digital still camera as an example of these devices.

An image pickup system 500 includes, as illustrated in FIG. 9, an image pickup device 100, an image pickup optical system 502, a CPU 510, a lens controlling unit 512, an image pickup device controlling unit 514, an image processing unit 516, a diaphragm shutter controlling unit 518, a display unit 520, an operation switch 522, and a recording medium 524.

The image pickup optical system 502 is an optical system configured to form an optical image of an object, and includes lens units, a diaphragm 504, and other components. The diaphragm 504 has a function of adjusting the amount of light in photographing through adjustment of the aperture diameter of the diaphragm 504, and also has a function of a shutter for adjusting exposure time in taking still images. The lens units and the diaphragm 504 are held to be retractably extendable in an optical axis direction, and a magnification varying function (zoom function) and a focus adjustment function are achieved by these components operating in conjunction with each other. The image pickup optical system 502 may be integral with the image pickup system or may be an image pickup lens mountable on the image pickup system.

The image pickup device 100 is placed so that its image pickup surface is located in the image space of the image pickup optical system 502. The image pickup device 100 is the image pickup device according to one of the first to third embodiments, and includes a CMOS sensor (pixel portion) and a peripheral circuit (peripheral circuit region). In the image pickup device 100, a two-dimensional single-chip color sensor is constructed by two-dimensionally arranging a plurality of pixels each including a photoelectric conversion portion and by providing color filters to these pixels. The image pickup device 100 performs photoelectric conversion on an object image formed by the image pickup optical system 502, and outputs the resultant as an image signal or a focus detection signal.

The lens controlling unit 512 controls the lens units of the image pickup optical system 502 to extend or retract, thereby performing magnification varying operation or focus adjustment, and includes circuits and processing devices configured to achieve such a function. The diaphragm shutter controlling unit 518 changes the aperture diameter of the diaphragm 504 (adjusts the aperture value), thereby adjusting the amount of light for photographing, and includes circuits and processing devices configured to achieve such a function.

The CPU 510 is a control device in the camera and performs various control processes of the camera body. The CPU 510 includes an arithmetic unit, a ROM, a RAM, an A/D converter, a D/A converter, a communication interface circuit, and other components. The CPU 510 controls the operation of each unit in the camera with the use of computer programs stored in, for example, the ROM, to thereby execute the series of photographing operation processes such as AF including detection of the focus state of the image pickup optical system 502 (focus detection), image pickup, image processing, and recording. The CPU 510 is also a signal processing unit.

The image pickup device controlling unit 514 controls the operation of the image pickup device 100, and performs A/D conversion on a signal that is output from the image pickup device 100 to transmit the signal to the CPU 510. The image pickup device controlling unit 514 includes circuits and control devices configured to achieve such a function. The image pickup device 100 may have the A/D conversion function. The image processing unit 516 performs image processing, such as y conversion or color interpolation, on signals subjected to A/D conversion, to thereby generate image signals, and includes circuits and control devices configured to achieve such a function. The display unit 520 is a display device such as a liquid crystal display device (LCD), and displays information on the photographing mode of the camera, preview images before photographing, confirmation images after photographing, a focus state detected in focus detection, and other matters. The operation switch 522 includes a power supply switch, a release (photographing trigger) switch, a zoom operation switch, a photographing mode selecting switch, and other components. The recording medium 524 records taken images and other matters. The recording medium 524 may be a device built in the image pickup system or a removably mountable device such as a memory card.

In this way, the image pickup device 100 according to one of the first to third embodiments is applied to the image pickup system 500 so that a high-performance image pickup system can be achieved.

Fifth Embodiment

Figure 10A:
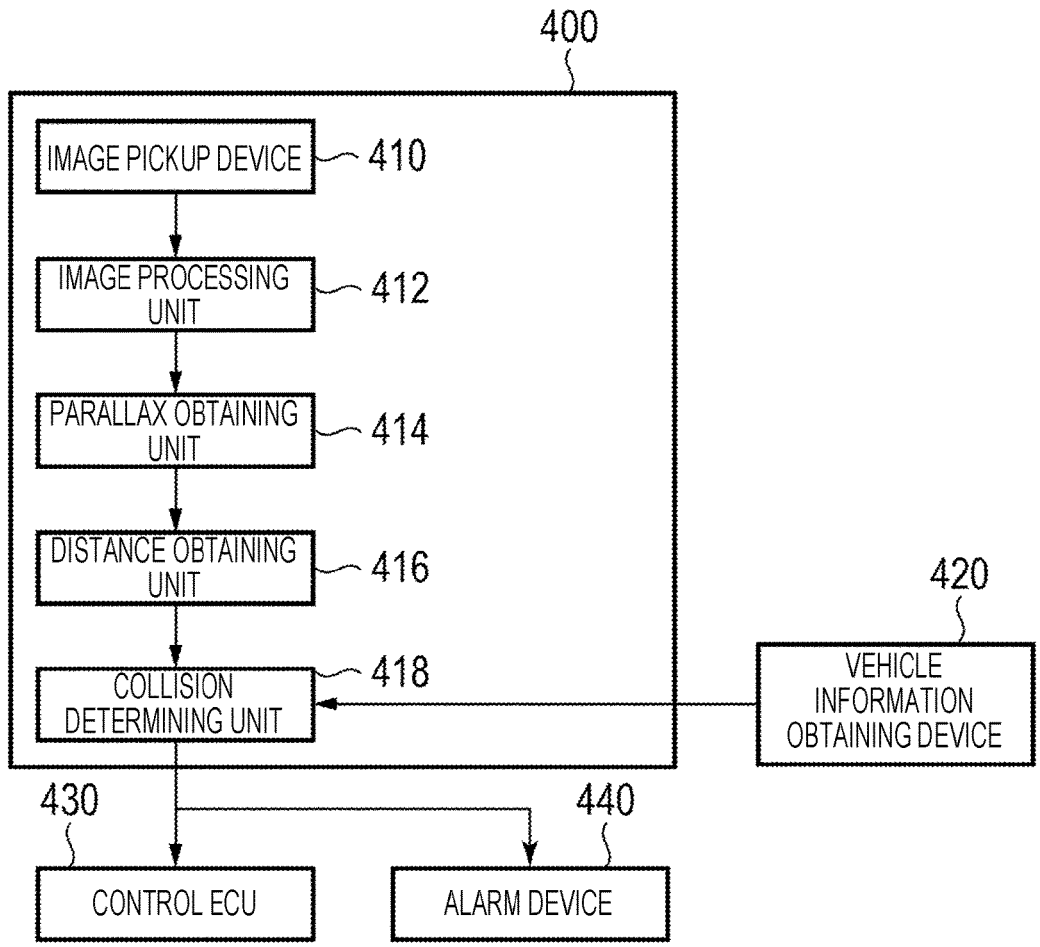
FIG. 10A is a block diagram of an image pickup system according to a fifth embodiment.
Figure 10B:
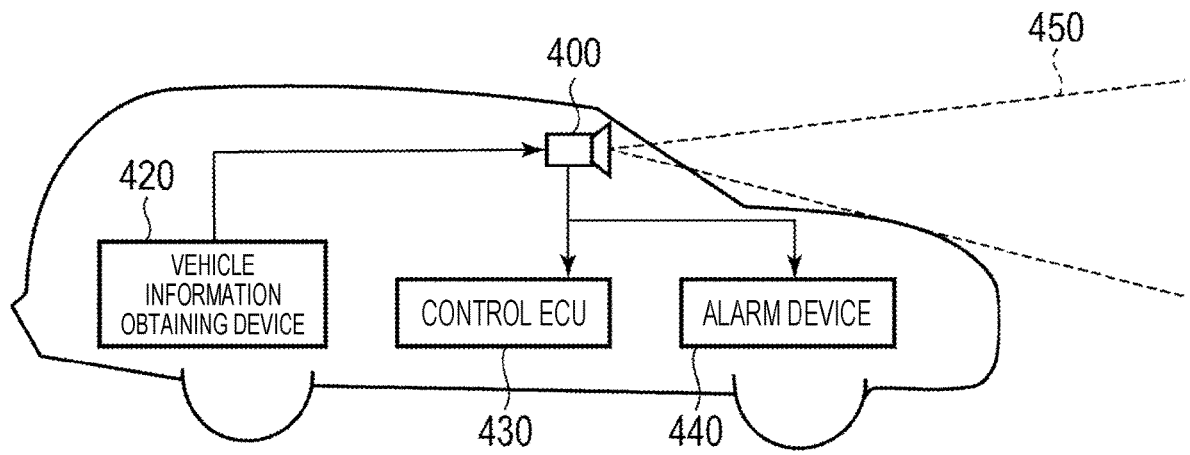
FIG. 10B is a block diagram of a moving apparatus according to the fifth embodiment.

An image pickup system and a moving apparatus according to a fifth embodiment of the present invention are described with reference to FIG. 10A and FIG. 10B. FIG. 10A and FIG. 10B are diagrams illustrating the configurations of the image pickup system and the moving apparatus according to the present embodiment.

FIG. 10A illustrates an example of an image pickup system 400 relating to a vehicle-mounted camera. The image pickup system 400 includes an image pickup device 410. The image pickup device 410 is one of the image pickup devices according to the first to third embodiments described above. The image pickup system 400 includes an image processing unit 412 configured to perform image processing on a plurality of image data that are obtained by the image pickup device 410, and a parallax obtaining unit 414 configured to calculate parallax (a phase difference between parallax images) from the plurality of image data that are obtained by the image pickup device 410. Further, the image pickup system 400 includes a distance obtaining unit 416 configured to calculate distance to an object on the basis of the calculated parallax, and a collision determining unit 418 configured to determine collision probability on the basis of the calculated distance. Here, the parallax obtaining unit 414 and the distance obtaining unit 416 are examples of a distance information obtaining unit configured to obtain information on distance to an object. Specifically, the distance information is information on parallax, defocus amounts, distance to an object, and other matters. The collision determining unit 418 may determine the collision probability by using one of the pieces of distance information. The distance information obtaining unit may be achieved by specifically designed hardware or a software module. Further, the distance information obtaining unit may be achieved by a field programmable gate array (FPGA) or an application specific integrated circuit (ASIC), for example, or a combination thereof.

The image pickup system 400 is connected to a vehicle information obtaining device 420, and can obtain vehicle information such as vehicle speed, yaw rates, and steering angles. Further, the image pickup system 400 is connected to a control ECU 430 that is a control device configured to output control signals for generating braking force on the vehicle on the basis of a determination result of the collision determining unit 418. That is, the control ECU 430 is an example of a moving apparatus controlling unit configured to control the moving apparatus on the basis of the distance information. Further, the image pickup system 400 is also connected to an alarm device 440 configured to issue alarms to a driver on the basis of the determination result of the collision determining unit 418. When the determination result of the collision determining unit 418 indicates high collision probability, for example, the control ECU 430 performs vehicle control for avoiding collision or reducing damage by, for example, braking, returning the accelerator, or reducing engine output. The alarm device 440 warns the user by, for example, issuing an alarm such as sound, displaying alarm information on the screen of, for example, a car navigation system, or vibrating seat belts or a steering.

In the present embodiment, the image pickup system 400 takes images around the vehicle, for example, the front-side or rear-side view of the vehicle. FIG. 10B illustrates the image pickup system 400 when taking images of the front-side view of the vehicle (image pickup range 450). The vehicle information obtaining device 420 issues an instruction for controlling the image pickup system 400 to operate to take images. The image pickup device according to one of the first to third embodiments described above is used as the image pickup device 410 so that the image pickup system 400 of the present embodiment can improve the precision of distance measurement.

In the above description, there is described the example in which the image pickup system is applied to the control for avoiding collision with another vehicle, but the image pickup system is also applicable to control for controlling the vehicle to follow another vehicle to automatically drive or control for controlling the vehicle to automatically drive while being in a lane, for example. In addition, the image pickup system can be applied not only to vehicles such as automobiles but also to moving apparatus (moving devices) such as ships, airplanes, or industrial robots. Besides, the image pickup system can be applied not only to the moving apparatus but also to apparatus that widely utilize object recognition, such as intelligent transport systems (ITS).

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD™), a flash memory device, a memory card, and the like.

The embodiments described above are merely specific examples of the present invention, and the scope of the present invention is not limited to the configurations of the above-mentioned embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-25217, filed on Feb. 15, 2018, which is hereby incorporated by reference herein in its entirety.

What is claimed is:

1. An image pickup device, comprising:
   a pixel configured to output a signal based on a light reception amount; and
   an AD converter configured to obtain, by using a ramp signal, a digital value corresponding to the signal that is output from the pixel,
   the AD converter including:
      an amplifier circuit configured to amplify the signal that is output from the pixel, wherein the amplifier circuit includes an amplifier, a plurality of capacitors, and a plurality of switches, each of the switches provided corresponding to one of the capacitors, and controlling electrical connection between the amplifier and a corresponding capacitor;
      a comparator circuit including an output node for outputting a comparison result signal generated by using an output signal from the amplifier circuit and the ramp signal;
      a memory configured to hold a digital value corresponding to the output signal, based on a result of the comparator circuit;
      a gain switching circuit configured to perform on/off control of the plurality of switches to as to switch a gain of the amplifier circuit based on the comparison result signal; and
      a ramp signal switching circuit configured to switch a slope of the ramp signal based on the comparison result signal.

2. The image pickup device according to claim 1, further comprising a selection circuit that is electrically connected to the output node,
   wherein the output node and the gain switching circuit are electrically connected to each other via the selection circuit, and
   wherein the output node and the ramp signal switching circuit are electrically connected to each other via the selection circuit.

3. The image pickup device according to claim 2,
   wherein the comparator circuit outputs, from the output node to the selection circuit, a second comparison result signal that is obtained through comparison between the output signal from the amplifier circuit and a threshold, and
   wherein the selection circuit outputs the second comparison result signal to one of the gain switching circuit and the ramp signal switching circuit.

4. The image pickup device according to claim 3,
   wherein the AD converter further includes a second memory configured to hold the second comparison result signal, and
   wherein the second memory and the selection circuit are electrically connected to the output node.

5. The image pickup device according to claim 4, further comprising a ramp signal supplying unit configured to output a first ramp signal having a first slope, and a second ramp signal having a second slope that is larger than the first slope,
   wherein the first ramp signal and the second ramp signal are input to the ramp signal switching circuit, and
   wherein the ramp signal switching circuit selects and outputs one of the first ramp signal and the second ramp signal, thereby switching the slope of the ramp signal that is output to the comparator circuit.

6. The image pickup device according to claim 5, wherein the AD converter has, as a driving mode:
   a first driving mode in which the ramp signal switching circuit switches the slope of the ramp signal to be used in AD conversion based on a magnitude of the signal that is output from the pixel; and
   a second driving mode in which the gain switching circuit switches a gain of the amplifier circuit based on the magnitude of the signal that is output from the pixel.

7. The image pickup device according to claim 2,
   wherein the pixel is one of a plurality of pixels arranged in columns,
   wherein the image pickup device further comprises a plurality of column circuits, each of the column circuits corresponding to a respective one of the columns, and each of the column circuits including the AD converter, and
   wherein the selection circuit is one of a plurality of selection circuits, each of the selection circuits corresponding to a respective one of the columns.

8. The image pickup device according to claim 1, further comprising a ramp signal supplying unit configured to output a first ramp signal having a first slope, and a second ramp signal having a second slope that is larger than the first slope,
   wherein the first ramp signal and the second ramp signal are input to the ramp signal switching circuit, and
   wherein the ramp signal switching circuit selects and outputs one of the first ramp signal and the second ramp signal, thereby switching the slope of the ramp signal that is output to the comparator circuit.

9. The image pickup device according to claim 1, wherein the AD converter has, as a driving mode:
   a first driving mode in which the ramp signal switching circuit switches the slope of the ramp signal to be used in AD conversion based on a magnitude of the signal that is output from the pixel; and
   a second driving mode in which the gain switching circuit switches a gain of the amplifier circuit based on the magnitude of the signal that is output from the pixel.

10. The image pickup device according to claim 9, wherein in the first driving mode, switching is performed to use, when the signal that is output from the pixel is a low luminance signal, a ramp signal having a slope smaller than a slope for a case where the signal that is output from the pixel is a high luminance signal.

11. The image pickup device according to claim 9, wherein in the first driving mode, switching is performed to use, when the output signal from the amplifier circuit is lower than a reference voltage, a ramp signal having a slope smaller than a slope for a case where the output signal from the amplifier circuit is higher than the reference voltage.

12. The image pickup device according to claim 9, wherein in the second driving mode, switching is performed to use, when the signal that is output from the pixel is a low luminance signal, a gain larger than a gain for a case where the signal that is output from the pixel is a high luminance signal.

13. The image pickup device according to claim 9, wherein in the second driving mode, switching is performed to use, when the output signal from the amplifier circuit is lower than a reference voltage, a gain larger than a gain for a case where the output signal from the amplifier circuit is higher than the reference voltage.

14. The image pickup device according to claim 9, further comprising a mode switching unit configured to switch the driving mode of the AD converter based on an imaging condition.

15. The image pickup device according to claim 14, wherein the imaging condition includes ISO speed and a frame rate, and
   wherein the mode switching unit performs:
      switching to the first driving mode when the ISO speed is higher than first sensitivity;
      switching to the second driving mode when the ISO speed is lower than second sensitivity; and
      in a case where the ISO speed is at least the second sensitivity and not more than the first sensitivity, switching to the first driving mode when the frame rate is higher than a predetermined frame rate, and otherwise switching to the second driving mode.

16. The image pickup device according to claim 14, wherein the imaging condition includes ISO speed, and
   wherein when the ISO speed is higher than predetermined sensitivity, the mode switching unit performs switching to the first driving mode, and otherwise performs switching to the second driving mode.

17. The image pickup device according to claim 14, wherein the imaging condition includes a frame rate, and
   wherein when the frame rate is higher than a predetermined frame rate, the mode switching unit performs switching to the first driving mode, and otherwise performs switching to the second driving mode.

18. The image pickup device according to claim 1, wherein the pixel is one of a plurality of pixels arranged in columns, and
   wherein the image pickup device further comprises a plurality of column circuits, each of the column circuits corresponding to a respective one of the columns, and each of the column circuits including the AD converter.

19. An image pickup system, comprising:
   the image pickup device according to claim 1; and
   a signal processor configured to process a signal that is output from the image pickup device.

20. A moving apparatus, comprising:
   the image pickup device according to claim 1;
   a distance information obtaining unit configured to obtain distance information on distance to an object, from the signal that is output from the pixel of the image pickup device; and
   a controller configured to control the moving apparatus based on the distance information.

* * * * *